(12) United States Patent
Zhang

(10) Patent No.: US 11,631,833 B2
(45) Date of Patent: Apr. 18, 2023

(54) LIGHT EMITTING DEVICE AND DISPLAY APPARATUS

(71) Applicant: BOE TECHNOLOGY GROUP CO., LTD., Beijing (CN)

(72) Inventor: Zhenqi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 17/214,068

(22) Filed: Mar. 26, 2021

(65) Prior Publication Data
US 2022/0059801 A1 Feb. 24, 2022

(30) Foreign Application Priority Data
Aug. 18, 2020 (CN) .......................... 202010830439.2

(51) Int. Cl.
*H01L 51/52* (2006.01)
*H01L 51/50* (2006.01)

(52) U.S. Cl.
CPC ........ *H01L 51/5262* (2013.01); *H01L 51/502* (2013.01); *H01L 2251/5315* (2013.01); *H01L 2251/5353* (2013.01); *H01L 2251/5369* (2013.01)

(58) Field of Classification Search
CPC ............... H01L 51/5262; H01L 51/502; H01L 2251/5315; H01L 2251/5353; H01L 2251/5369; H01L 51/5265; B82Y 20/00
See application file for complete search history.

(56) References Cited

U.S. PATENT DOCUMENTS

| | | | |
|---|---|---|---|
| 2005/0088078 A1* | 4/2005 | Tseng .................... | B82Y 30/00 313/504 |
| 2005/0189205 A1* | 9/2005 | Fujii ...................... | H01H 9/182 200/314 |
| 2012/0313129 A1* | 12/2012 | Zettsu ................. | H01L 51/5088 257/E33.061 |
| 2014/0061593 A1* | 3/2014 | Liu, Jr. ................ | H01L 51/5072 257/E51.019 |
| 2015/0001464 A1* | 1/2015 | Fukuura ................ | H01L 49/006 |
| 2018/0212201 A1* | 7/2018 | Bai ....................... | H01L 51/5271 |
| 2021/0294009 A1* | 9/2021 | Misawa ............ | H01L 31/02167 |

* cited by examiner

*Primary Examiner* — Donald L Raleigh
(74) *Attorney, Agent, or Firm* — Houtteman Law LLC

(57) ABSTRACT

The present disclosure provides a light emitting device and a display apparatus. The light emitting device includes: a substrate; a first electrode, a functional layer and a second electrode which are sequentially arranged on the substrate, where the functional layer at least includes a light emitting layer, a dielectric layer is arranged between at least one of the first electrode and the second electrode and the functional layer, metal nanoparticles are arranged in the dielectric layer, and a localized plasmon resonance frequency of the metal nanoparticles is matched with a wavelength of light emitted by the light emitting layer.

10 Claims, 3 Drawing Sheets

LIGHT EMITTING DEVICE AND DISPLAY APPARATUS

CROSS-REFERENCE TO RELATED APPLICATIONS

The present application claims the priority of Chinese Patent Application No. 202010830439.2, filed on Aug. 18, 2020, the contents of which are incorporated herein in their entirety by reference.

TECHNICAL FIELD

The present disclosure relates to the field of display technology, and particularly relates to a light emitting device and a display apparatus.

BACKGROUND

An organic light emitting diode (OLED) is a light emitting device using an organic solid semiconductor as a light emitting material, and has a wide application prospect due to its advantages of simple preparation process, low cost, low power consumption, high luminance, wide range of working temperature, and the like. However, the preparation process of the OLED device mainly depends on evaporation, and thus a certain difficulty exists in the aspect of high-precision display, and the utilization rate of material is low. In recent years, quantum dot materials have gradually emerged, and the spectrum of light emitted by the quantum dot materials is narrower than that of light emitted by organic materials, and the stability of the quantum dot materials is better than that of organic materials, and thus quantum dot light emitting diodes (QLEDs) are bred and widely applied to the display field.

SUMMARY

In a first aspect, an embodiment of the present disclosure provides a light emitting device, including: a substrate; a first electrode, a functional layer and a second electrode sequentially disposed on the substrate, where the functional layer at least includes a light emitting layer, where a dielectric layer is arranged between at least one of the first electrode and the second electrode and the functional layer, and metal nanoparticles are arranged in the dielectric layer, a localized plasmon resonance frequency of the metal nanoparticles is matched with a wavelength of light emitted by the light emitting layer.

In some implementations, the dielectric layer is a single layer structure, and the metal nanoparticles include two different sizes of metal nanoparticles.

In some implementations, the dielectric layer includes a first sub-dielectric layer and a second sub-dielectric layer stacked in a direction away from the light emitting layer, the metal nanoparticles are disposed in both the first sub-dielectric layer and the second sub-dielectric layer, and a size of each of the metal nanoparticles disposed in the second sub-dielectric layer is greater than a size of each of the metal nanoparticles disposed in the first sub-dielectric layer.

In some implementations, the first electrode is an anode, the second electrode is a cathode, and the functional layer further includes a hole injection layer and a hole transport layer, which are sequentially disposed between the substrate and the light emitting layer in a direction away from the substrate; the dielectric layer is disposed between the anode and the hole injection layer.

In some implementations, the first electrode is a cathode, the second electrode is an anode, the functional layer further includes an electron transport layer between the substrate and the light emitting layer, and the dielectric layer is disposed between the cathode and the electron transport layer.

In some implementations, the first electrode is a cathode, the second electrode is an anode, the functional layer further includes an electron injection layer and an electron transport layer, which are sequentially disposed between the substrate and the light emitting layer in a direction away from the substrate, and the dielectric layer is disposed between the cathode and the electron injection layer.

In some implementations, one of the first electrode and the second electrode is a transparent electrode and the other is a reflective electrode.

In some implementations, the metal nanoparticles have a size ranging from about 5 nm to about 450 nm.

In some implementations, a material of the metal nanoparticles includes any one or more of gold, silver, platinum.

In some implementations, a material of the dielectric layer includes polyoxymethylene.

In some implementations, the light emitting device is an organic light emitting diode or a quantum dot light emitting diode.

In a second aspect, an embodiment of the present disclosure provides a display apparatus including the light emitting device described above.

DESCRIPTION OF EMBODIMENTS

Figure 1:
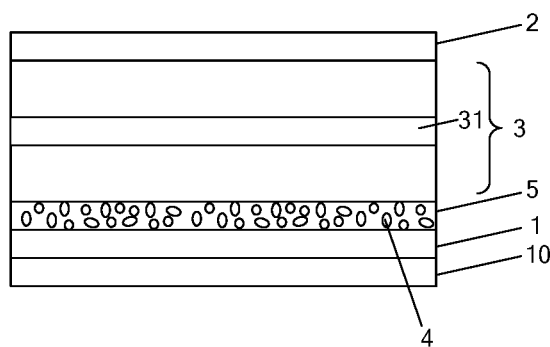
FIG. 1 is a schematic structural diagram of a light emitting device according to an embodiment of the present disclosure.

In order that those skilled in the art will better understand the technical solutions of the present disclosure, the following detailed description is given with reference to the accompanying drawings and the specific embodiments.

Unless defined otherwise, technical or scientific terms used herein shall have the ordinary meaning as understood by one of ordinary skill in the art to which the present disclosure belongs. The use of "first", "second" and the like in the present disclosure is not intended to indicate any order, quantity, or importance, but rather is used to distinguish one element from another. Also, the use of the terms "a", "an" or "the" and similar referents do not denote a limitation of quantity, but rather denote the presence of at least one. The word "include" or "comprise" and the like means that the element or item appearing in front of the word includes the element or item listed after the word, and the equivalent thereof, but does not exclude other elements or items. The terms "connected" or "coupled" and the like are not restricted to physical or mechanical connections, but may include electrical connections, whether direct or indirect. Positional relationship terms (e.g., "on") are used merely to denote relative positional relationships that may change when the absolute position of the object being described changes.

The basic structure of a light emitting device includes an anode, a cathode, and a light emitting layer between the anode and the cathode. Under the action of an applied voltage, electrons and holes are injected from the cathode and the anode respectively, then migrate into the light emitting layer, and meet and recombine in the light emitting layer to generate excitons, and the energy of the excitons is attenuated in the form of light, and thus light is emitted. The light extraction efficiency of the light emitting device is one of indexes for measuring the performance of the light emitting device.

Currently, two methods are generally adopted to improve the light extraction efficiency: one method is to increase the internal quantum efficiency, and the other method is to increase the external quantum efficiency. When photons are incident on a surface of a photosensitive material, a portion of the photons are absorbed to excite the photosensitive material to generate electron-hole pairs, and current is generated, where a ratio of the number of generated electrons to the number of absorbed photons is called the internal quantum efficiency; and a ratio of the number of generated electrons to the number of all incident photons is called the external quantum efficiency. The internal quantum efficiency is mainly used for measuring a proportion of excitons transformed into photons for emitting light to all the excitons generated by recombination of injected carriers in the light emitting layer. Taking the light emitting device as an OLED as an example, increasing the internal quantum efficiency can be achieved by improving material properties or using phosphorescent materials, and the internal quantum efficiency can reach nearly 100% in theory. Improving the external quantum efficiency is to improve the light coupling efficiency of the OLED, and for a planar light emitting device, only about 20% of photons can be extracted when the excitons emit light, and most (80%) of energy is lost in multiple modes, for example, a substrate mode occurring at refractive or reflective interfaces between an anode and a substrate of the OLED, between the substrate and air, etc., a waveguide mode occurring at an interface between the anode and a light emitting layer of the OLED, and a surface plasmon (SP) mode occurring near a metal electrode. More than 40% of the light is confined in the OLED by the SP mode, 15% and 23% of the light are confined in the OLED by the waveguide mode and the substrate mode, respectively, and the loss due to metal absorption is 4%, so that only about 20% of the light emitted from the light emitting layer can pass through the OLED into the air to be seen by human eyes.

In order to improve the light extraction efficiency of the light emitting device, a layer of metal nanoparticles can be formed between the light emitting layer and the anode and/or between the light emitting layer and the cathode, and the localized surface plasmon resonance frequency of the metal nanoparticles is matched with the wavelength of light emitted by the light emitting layer, so that the light extraction efficiency of the light emitting device can be improved.

Specifically, surface plasmon (SP) refers to an electron dilatational wave that is generated by interaction between the electrons, that are free to vibrate on a metal surface and are excited by electrons or light waves, and electrons or photons, the electron dilatational wave propagates along the metal surface, is an electromagnetic surface wave, and can laterally limit a light wave in a scale range of sub-wavelength. Near a resonant frequency, the electron dilatational wave has a flat dispersion curve and a large photon mode density, and when it interacts with the surrounding medium, the spontaneous emission thereof is enhanced. The electron dilatational wave has the maximum field intensity at the surface, and has an electric field exponentially decaying in a direction vertical to the interface. If the metal surface is very rough or near a curved structure (such as sphere, cylinder, etc.) of the metal, the surface plasmon cannot propagate along the interface in the form of waves, but is localized near the surface of the structure, and in such case, the surface plasmon (SP) is called localized surface plasmon (LSP). When metal particles each with a size approaching to or smaller than the wavelength of light are illuminated, an oscillating electric field displaces electron clouds relative to the nuclei of the metal particles, generating a restoring force due to the coulomb attraction between the electron clouds and the nuclei, causing the electron clouds to oscillate around the nuclei, such collective oscillation of the electron clouds being known as localized surface plasmon resonance.

When localized surface plasmon resonance occurs, the electromagnetic field around the metal particles is greatly enhanced. The metal particle can then be considered as a nanolens and the oscillating plasmon is a photon that is strongly confined to a nanometer sized particle. The surface plasmon resonance produces a significant effect that, radiation with the same wavelength as that of fluorescent molecule is produced by the surface plasmon under a fluorescence induction of excited photons (light emitting photons in the light emitting layer), and an attenuation rate of radiation of the system is raised simultaneously, fluorescence lifetime of the photons is shortened, fluorescence quantum efficiency is increased and fluorescence emission is enhanced.

It should be noted that, in the above description, the light emitting device is taken as an OLED as an example, and the QLED is different from the OLED only in the material of the light emitting layer, and the light emitting principle of the QLED is substantially the same as that of the OLED.

In summary, although the light extraction efficiency of the light emitting device can be increased by adding the metal nanoparticles and using the principle of localized surface plasmon resonance, when oxygen permeates into the light emitting device, the oxygen may damage the light emitting device, resulting in a decrease in the lifetime of the light emitting device. In view of this problem, the following technical solutions are provided in the embodiments of the present disclosure.

Figure 2:
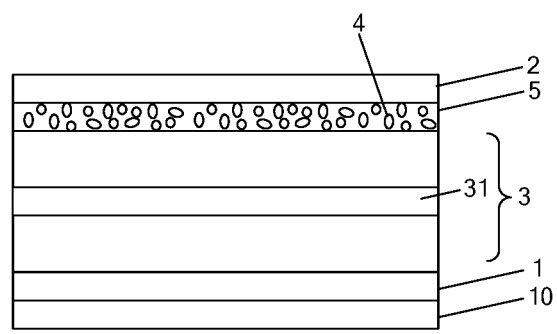
FIG. 2 is another schematic structural diagram of a light emitting device according to an embodiment of the present disclosure.
Figure 3:
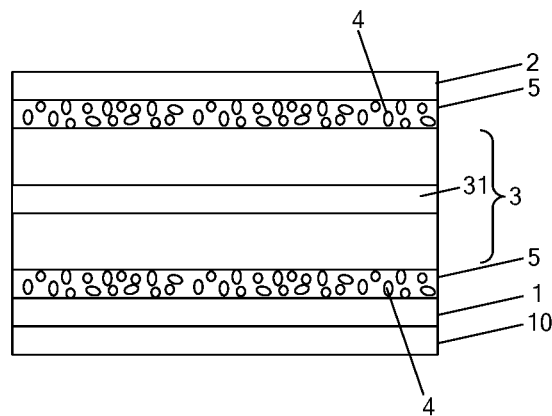
FIG. 3 is a further schematic structural diagram of a light emitting device according to an embodiment of the present disclosure.

In a first aspect, as shown in FIGS. 1 to 3, an embodiment of the present disclosure provides a light emitting device, which includes a substrate 10, a first electrode 1, a functional layer 3, and a second electrode 2 sequentially arranged along a direction away from the substrate 10; where one of the first electrode 1 and the second electrode 2 is an anode 11, and the other is a cathode 21; the functional layer 3 at least includes a light emitting layer 31. Specifically, a dielectric layer 5 is provided between the first electrode 1 and the functional layer 3 of the light emitting device, and metal nanoparticles 4 are provided in the dielectric layer 5. Alternatively, a dielectric layer 5 may be provided between the second electrode 2 and the functional layer 3 of the light emitting device, and metal nanoparticles 4 may be provided in the dielectric layer 5. The localized surface plasmon resonance frequency of the metal nanoparticles 4 is matched with a wavelength of light emitted by the light emitting layer 31, and the dielectric layer 5 is made of a polymer containing polyoxymethylene (POM).

It should be noted that, the fact that the localized surface plasmon resonance frequency of the metal nanoparticles 4 being matched with the wavelength of light emitted by the light emitting layer 31 means that a size of each of the metal nanoparticles 4 approaches to or is smaller than the wavelength of light emitted by the light emitting layer 31, and thus, when the metal nanoparticles 4 are illuminated with light, an oscillating electric field displaces electron clouds relative to the nuclei of the metal nanoparticles 4, generating a restoring force due to the coulomb attraction between the electron clouds and the nuclei, causing the electron clouds to oscillate around the nuclei, that is, localized surface plasmon resonance occurs.

Polyformaldehyde (POM) is an engineering plastic with excellent performance and is called "seizing-steel" or "ultra-steel". Polyoxymethylene has a hardness, a strength and a rigidity similar to those of metal, good self-lubricity over a wide range of temperatures and humidity, good fatigue resistance, and elasticity, and in addition, it has good chemical resistance. POM is replacing metals in many markets, which are traditionally occupied by metals such as zinc, brass, aluminum and steel, at a lower cost than many other engineering plastics, polyoxymethylene has been widely used in the fields of electronics, machinery, instruments, daily light industry, automobiles, building materials, agriculture and the like after being invented.

In some implementations, a material of the dielectric layer 5 may be polyoxymethylene or a copolymer containing polyoxymethylene.

In some implementations, a material of the metal nanoparticles 4 is generally an inert noble metal, such as any one of gold (Au), silver (Ag), platinum (Pt), and aluminum (Al), or an alloy of gold, silver, platinum, and aluminum, or any combination of gold, silver, platinum, and aluminum; the metal nanoparticles 4 each have any one or any combination of a spherical shape, a prismatic shape, a cubic shape, a cage shape, and a core-shell structure. A size of each of the metal nanoparticles 4 required for generating LSP may range from about 5 nm to 450 nm, and specifically range from about 5 nm to about 100 nm, according to the wavelength of light emitted from the light emitting device of different colors (red/green/blue).

In the embodiment of the present disclosure, the metal nanoparticles 4 with the localized surface plasmon resonance frequency matched with the wavelength of light emitted by the light emitting layer 31 are disposed in the light emitting device, so that the light extraction efficiency of the light emitting device can be improved, the principle will not repeated here. In particular, the dielectric layer 5 of the polymer material containing polyformaldehyde is formed between the electrode (the first electrode 1 and/or the second electrode 2) and the functional layer 3 of the light emitting device, the polyformaldehyde can release formaldehyde very slowly, and the formaldehyde can react with oxygen under the catalytic action of the metal nanoparticles 4 to be converted into formic acid, so that the oxygen is prevented from damaging the light emitting device.

In some implementations, the substrate 10 is used as a support for electrode layers and functional layers in the light emitting device, has good light transmittance for visible light, has a certain ability to prevent water vapor and oxygen from permeating, has good surface smoothness, and can be made of glass, a flexible substrate, an array substrate, or the like. If the flexible substrate is selected to be used as the substrate 10, the flexible substrate may be made of polyester, polyimide, or a relatively thin metal.

In some implementations, the dielectric layer 5 of the light emitting device is only disposed between the first electrode 1 and the functional layer 3, that is, the dielectric layer 5 may be formed first and then the functional layer 3 is formed, so that the performance of the functional layer 3 is effectively prevented from being affected when the dielectric layer 5 is formed. Certainly, it is also possible that the dielectric layer 5 is provided between the second electrode 2 and the functional layer 3, and for convenience of description, the dielectric layer 5 is provided between the first electrode 1 and the functional layer 3 in the following description as an example.

Since the dielectric layer 5 is disposed between the first electrode 1 and the functional layer 3, where the functional layer 3 generally includes not only the light emitting layer 31 but also a carrier transport layer disposed between the first electrode 1 and the light emitting layer 31, the carrier transport layer may be a hole transport layer 32 if the first electrode 1 is the anode 11, and may be an electron transport layer 34 if the first electrode 1 is the cathode 21. Therefore, the size of each of the metal nanoparticles 4 in the dielectric layer 5 will ensure that the dielectric layer 5 can electrically connect the first electrode 1 with the carrier transport layer well while ensuring that the LSP can be realized. In this regard, the embodiment of the present disclosure provides the following two implementations.

Figure 4:
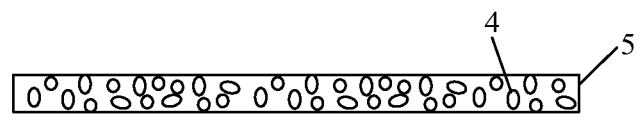
FIG. 4 is a schematic diagram of a dielectric layer of a light emitting device according to an embodiment of the present disclosure.

In an implementation, as shown in FIG. 4, the dielectric layer 5 has a single-layer structure, and the metal nanoparticles 4 include two different sizes of metal nanoparticles 4, where the smaller sized metal nanoparticles 4 in the two different sized metal nanoparticles 4 have good LSP characteristics, and the larger sized metal nanoparticles 4 have good conductivity. Certainly, only one size of metal nanoparticles 4 may be disposed in the dielectric layer 5, as long as the metal nanoparticles 4 can generate the LSP. The smaller sized metal nanoparticles 4 may have a size ranging from about 2 nm to about 300 nm, and the larger sized metal nanoparticles 4 may have a size ranging from about 50 nm to about 5000 nm. In the case where both the larger sized metal nanoparticles 4 and the smaller sized metal nanoparticles 4 can be formed in the dielectric layer, the larger sized metal nanoparticles 4 and the smaller sized metal nanoparticles 4 are physically mixed in the dielectric layer 5 such that the dielectric layer 5 includes the larger sized metal nanoparticles 4 and the smaller sized metal nanoparticles 4.

Figure 5:
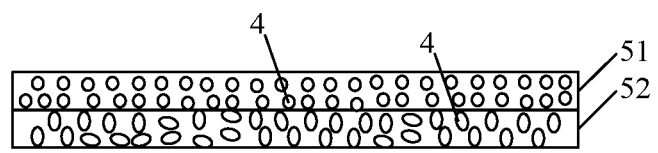
FIG. 5 is another schematic diagram of a dielectric layer of a light emitting device according to an embodiment of the present disclosure.

In another implementation, as shown in FIG. 5, the dielectric layer 5 adopts a double-layer structure, i.e., the dielectric layer 5 includes a first sub-dielectric layer 51 and a second sub-dielectric layer 52 which are stacked; where the first sub-dielectric layer 51 and the second sub-dielectric layer 52 may be sequentially disposed in a direction away from the light emitting layer 31. The metal nanoparticles 4 are disposed in both the first sub-dielectric layer 51 and the second sub-dielectric layer 52, and the size of each of the metal nanoparticles 4 disposed in the second sub-dielectric layer 52 is larger than the size of each of the metal nanoparticles 4 disposed in the first sub-dielectric layer 51. In such case, the smaller sized metal nanoparticles 4 in the first sub-dielectric layer 51 generate the LSP, and the second sub-dielectric layer 52 has good conductivity by disposing the larger sized metal nanoparticles 4. The size ranges of the smaller sized metal nanoparticles 4 and the larger sized metal nanoparticles 4 may be the same as those in the above-described implementation, and the smaller sized metal nanoparticles 4 and the larger sized metal nanoparticles 4 may be physically mixed in the first sub-dielectric layer 51 and the second sub-dielectric layer 52, respectively, which will not be described in detail herein.

In the embodiment of the present disclosure, the light emitting device may be an OLED or a QLED.

When the light emitting device is an OLED, the light emitting layer 31 may be made of the following materials:

(1) an undoped fluorescent organic material (composed of a light emitting material with hole transport capability), where the light emitting material with hole transport capability may be NPB, DPVBI or the like;

(2) an organic material doped with fluorescent material (composed of a fluorescent dopant and a host material), where the fluorescent dopant may be coumarin dye (coumarins 6, C-545T), quinacridone (DMQA), DCM series or the like;

(3) an organic material doped with phosphorescent material (composed of a phosphorescent dopant and a host material), where the phosphorescent dopant may be a metal complex light emitting material based on Ir, Pt, Ru, Cu, etc., such as Flrpic, Fir6, FirN4, FIrtaz, Ir(ppy)3, Ir(ppy)2(acac), PtOEP, (btp)2Iracac, Ir(piq)2(acac), (MDQ)2Iracac, or the like.

The host material in the organic material doped with the fluorescent material and the organic material doped with the phosphorescent material may adopt: metal complex materials, anthracene derivatives, aromatic diamine compounds, triphenylamine compounds, aromatic triamine compounds, biphenyldiamine derivatives, triarylamine polymers, and the like, and specifically, the following materials may be used: bis(2-methyl-8-quinolinol)(p-phenylphenol)aluminum (Balq), 9,10-bis-(2-naphthyl)Anthracene(ADN), TAZ, CBP, MCP, TCTA, NPB, or the like.

When the light emitting device is a QLED, the light emitting layer 31 may be made of the following materials.

When the material of the light emitting layer 31 is a quantum dot material, examples of the quantum dot material include CdS/ZnS, CdSe/ZnS, CdSe/ZnSes, CdSe/CdS, ZnSe/ZnS, InP/ZnS, CuInS/ZnS, (Zn)CuInS/ZnS, (Mn) CuInS/ZnS, AgInS/ZnS, (Zn)AgInS/ZnS, CuInSe/ZnS, CuInSeS/ZnS, PbS/ZnS, organic-inorganic perovskite materials, and inorganic perovskite materials.

Examples of organic-inorganic perovskite materials include MAPbX3, where MA represents CH3NH3 and X represents a halide. Examples of inorganic perovskite materials include CsSb2Br9, CsBi2Br9, CsPbX3, where X represents a halide. In some implementations, a quantum dot includes a core and a shell covering the core. In some implementations, the core includes a material selected from the group consisting of CdS, CdSe, ZnSe, InP, CuInS, (Zn)CuInS, (Mn)CuInS, AgInS, (Zn)AgInS, CuInSe, CuInSeS, PbS, organic-inorganic perovskite materials, inorganic perovskite materials and any combination or alloy thereof. In some implementations, the shell includes a material selected from the group consisting of ZnS, ZnSeS, CdS, organic-inorganic perovskite materials, inorganic perovskite materials and any combination or alloy thereof.

In the embodiment of the present disclosure, the light emitting device may be a forward light emitting device or an inverted light emitting device. For the forward light emitting device, the first electrode 1 is the anode 11, and the second electrode 2 is the cathode 21; and for the inverted light emitting device, the first electrode 1 is the cathode 21 and the second electrode 2 is the anode 11. Whether the light emitting device is a forward light emitting device or an inverted light emitting device, the light emitting device may be a top-emission type light emitting device or a bottom-emission type light emitting device; when the light emitting device is a top-emission type light emitting device, the first electrode 1 is a reflective electrode and the second electrode 2 is a transmissive electrode; when the light emitting device is a bottom-emission type light emitting device, the first electrode 1 is a transmissive electrode and the second electrode 2 is a reflective electrode. A specific structure of the light emitting device is explained below according to the type of the light emitting device.

Figure 6:
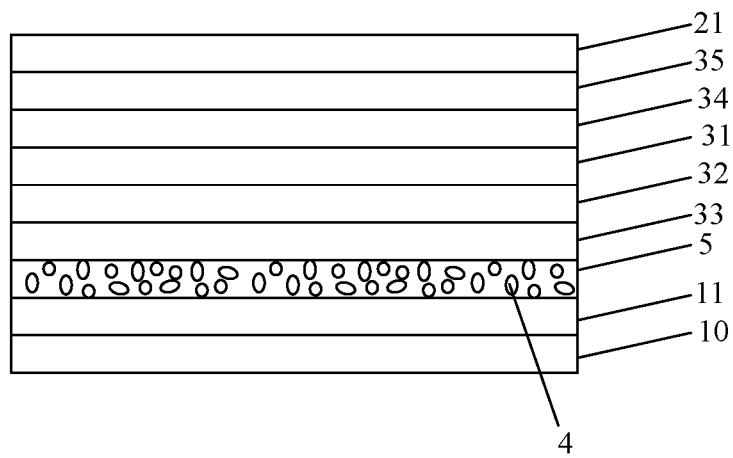
FIG. 6 is a schematic structural diagram of a forward light emitting device according to an embodiment of the present disclosure.

In an implementation, as shown in FIG. 6, the light emitting device is a forward light emitting device, and the first electrode 1 is the anode 11; the second electrode 2 is the cathode 21; the functional layer 3 includes a hole injection layer (HIL) 33, a hole transport layer (HTL) 32, a light emitting layer 31, and an electron transport layer (ETL) 34, which are sequentially disposed in a direction away from the first electrode 1. Certainly, an electron injection layer (EIL) 35 may be further disposed between the electron transport layer 34 and the cathode 21. A dielectric layer 5 is disposed between the hole injection layer 33 and the anode 11, and metal nanoparticles 4 are disposed in the dielectric layer 5. The material of the light emitting layer 31 may be any of the materials described above.

The anode 11 includes, but is not limited to, a flexible electrode, and the material thereof includes, but is not limited to, a high work function metal material (e.g., gold, copper, silver, platinum, etc.), an inorganic metal oxide (e.g., indium tin oxide (ITO), zinc oxide (ZnO), etc.), or an organic conductive polymer (e.g., poly 3,4-ethylenedioxythiophene/polystyrene sulfonate (PEDOT:PSS), polyaniline PANI, etc.).

The cathode 21 includes, but is not limited to, a flexible electrode made of a material including, but not limited to, a low work function metal material, such as lithium, magnesium, calcium, strontium, aluminum, indium, etc., or an alloy of the above metal with copper, gold, silver, etc., or a very thin buffer insulating layer (such as LiF, $CsCO_3$, etc.) and the above metal or alloy.

A material of the hole injection layer 33 includes, but is not limited to, poly(3,4-ethylenedioxythiophene) polystyrene sulfonate (PEDOT:PSS), polythiophene, polyaniline, polypyrrole, copper phthalocyanine, and 4,4',4"-tris(N,N-phenyl-3-methylphenylamino) triphenylamine (m-MT-DATA), $MoO_3$, CuPc, poly(3,4-ethylenedioxythiophene) polystyrene sulfonate (PEDOT:PSS).

A material of the hole transport layer 32 includes, but is not limited to, p-type polymer materials and various p-type low molecular weight materials, for example, polythiophene, polyaniline, polypyrrole, and a mixture having poly-3,4-ethylenedioxythiophene and poly(sodium p-styrenesulfonate), 4,4'-cyclohexylidenebis [N,N-bis(4-methylphenyl) aniline (TAPC), 4,4',4"-tris(N-carbazolyl) triphenylamine (TCTA), N,N'-bis(1-naphthyl)-N,N'-diphenylbenzidine (NPB), or any combination thereof.

A material of the electron transport layer 34 includes, but is not limited to, zinc oxide, magnesium zinc oxide, aluminum zinc oxide, and magnesium aluminum zinc oxide.

A material of the electron injection layer 35 includes, but is not limited to, any one of lithium fluoride, sodium fluoride, potassium fluoride, rubidium fluoride, cesium fluoride, lithium oxide, and lithium metaborate.

As for the above-described forward light emitting device, the light emitting device may be either a top-emission type light emitting device or a bottom-emission type light emitting device. When the forward light emitting device is of a top-emission type, the anode 11 is a reflective electrode, and the cathode 21 is a transmissive electrode; in such case, the anode 11 may be a composite film layer made of ITO/Ag/ITO material (Ag film layer as a reflective layer), for example; the cathode 21 may be a composite film layer made of Mg:Ag/ITO material, but a thickness of the cathode 21 should ensure that the cathode 21 can transmit light. When the forward light emitting device is of a bottom-emission type, the anode 11 may be made of a transparent conductive material such as indium tin oxide ITO or zinc oxide ZnO, and the cathode 21 may be made of an Al material.

Figure 7:
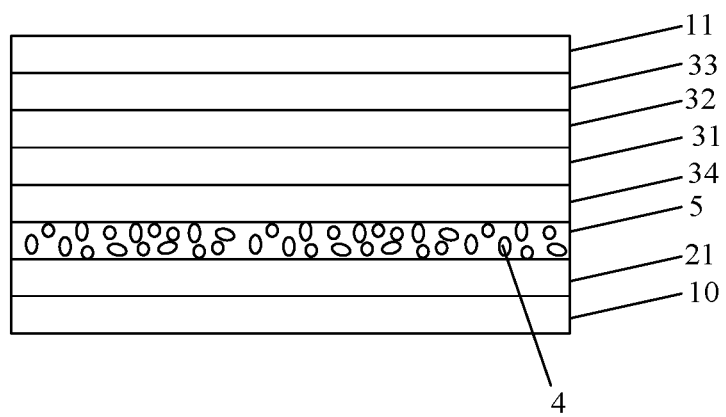
FIG. 7 is a schematic structural diagram of an inverted light emitting device according to an embodiment of the present disclosure.
Figure 8:
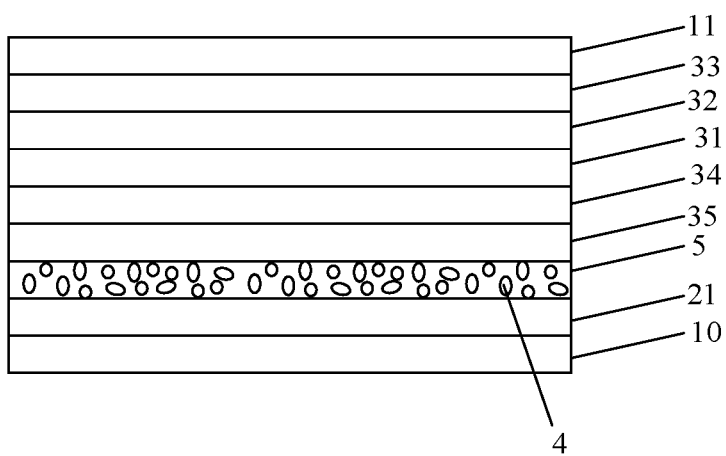
FIG. 8 is another schematic structural diagram of an inverted light emitting device according to an embodiment of the present disclosure.

In another implementation, as shown in FIGS. 7 and 8, the light emitting device is an inverted light emitting device, and the first electrode 1 is the cathode 21; the second electrode 2 is the anode 11; the functional layer 3 includes an electron transport layer 34, a light emitting layer 31, a hole transport layer 32, and a hole injection layer 33, which are sequentially arranged in a direction away from the first electrode 1. Certainly, an electron injection layer (EIL) 35 may be further disposed between the electron transport layer 34 and the cathode 21. As shown in FIG. 7, when the electron injection layer 35 is not provided in the light emitting device, the dielectric layer 5 is provided between the electron transport layer 34 and the cathode 21, and the metal nanoparticles 4 are provided in the dielectric layer 5; as shown in FIG. 8, when the electron injection layer 35 is provided in the light emitting device, the dielectric layer 5 is provided between the electron injection layer 35 and the cathode 21, and the metal nanoparticles 4 are provided in the dielectric layer 5. The material of the light emitting layer 31 may be any of the materials described above. The same materials as described above can be used for the electron injection layer 35, the electron transport layer 34, the hole transport layer 32, and the hole injection layer 33.

Similarly, when the inverted light emitting device is of a top-emission type, the cathode 21 is a reflective electrode, and the anode 11 is a transmissive electrode; in such case, the cathode 21 may be a composite film layer made of ITO/Ag/ITO material (Ag film layer as a reflective layer), for example; the anode 11 may be a composite film made of Mg:Ag/ITO material, but a thickness of the anode 11 should ensure that the anode 11 can transmit light. When the inverted light emitting device is of a bottom-emission type, the cathode 21 may be made of a transparent conductive material such as indium tin oxide ITO or zinc oxide ZnO, and the anode 11 may be made of an Al material.

In a second aspect, an embodiment of the present disclosure provides a display apparatus including the light emitting device described above, so that the display apparatus has good light extraction efficiency and a long service life.

The display apparatus may be any product or component with a display function, such as electronic paper, an OLED panel, a QLED panel, a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A light emitting device, comprising:
a substrate;
a first electrode, a functional layer and a second electrode sequentially disposed on the substrate, the functional layer at least including a light emitting layer, wherein,
a dielectric layer is arranged between the first electrode and the functional layer or between the second electrode and the functional layer, and metal nanoparticles are arranged in the dielectric layer,
a localized plasmon resonance frequency of the metal nanoparticles is matched with a wavelength of light emitted by the light emitting layer,
wherein the dielectric layer comprises a first sub-dielectric layer and a second sub-dielectric layer which are stacked in a direction away from the light emitting layer, the metal nanoparticles are disposed in both the first sub-dielectric layer and the second sub-dielectric layer, and a size of each of the metal nanoparticles disposed in the second sub-dielectric layer is greater than a size of each of the metal nanoparticles disposed in the first sub-dielectric layer.

2. The light emitting device according to claim 1, wherein the first electrode is an anode, the second electrode is a cathode, and the functional layer further comprises a hole injection layer and a hole transport layer which are sequentially provided between the substrate and the light emitting layer in a direction away from the substrate; the dielectric layer is disposed between the anode and the hole injection layer.

3. The light emitting device according to claim 1, wherein the first electrode is a cathode, the second electrode is an anode, the functional layer further comprises an electron transport layer between the substrate and the light emitting layer, and the dielectric layer is disposed between the cathode and the electron transport layer.

4. The light emitting device according to claim 1, wherein the first electrode is a cathode, the second electrode is an anode, the functional layer further includes an electron injection layer and an electron transport layer which are sequentially disposed between the substrate and the light emitting layer in a direction away from the substrate, and the dielectric layer is disposed between the cathode and the electron injection layer.

5. The light emitting device according to claim 1, wherein one of the first electrode and the second electrode is a transparent electrode and the other is a reflective electrode.

6. The light emitting device according to claim 1, wherein a size of each of the metal nanoparticles ranges from about 5 nm to about 450 nm.

7. The light emitting device according to claim 1, wherein a material of the metal nanoparticles comprises any one or more of gold, silver, platinum.

8. The light emitting device according to claim 1, wherein a material of the dielectric layer comprises polyoxymethylene.

9. The light emitting device according to claim 1, wherein the light emitting device is an organic electroluminescent diode or a quantum dot electroluminescent diode.

10. A display apparatus, comprising the light emitting device according to claim 1.

\* \* \* \* \*